(12) United States Patent
Camiener et al.

(10) Patent No.: US 7,043,408 B2
(45) Date of Patent: May 9, 2006

(54) COMPUTER-AIDED DESIGN NEUTRAL GRAPHICAL DATA INTERFACE

(75) Inventors: Jeffrey Camiener, West Bloomfield, MI (US); David Kassel, San Francisco, CA (US); Michael McCoy, Idaho Falls, ID (US)

(73) Assignee: Virtual Supply Chain Engineering, Inc., Rochester Hills, MI (US)

( * ) Notice: Subject to any disclaimer, the term of this patent is extended or adjusted under 35 U.S.C. 154(b) by 758 days.

(21) Appl. No.: 10/010,882

(22) Filed: Nov. 8, 2001

(65) Prior Publication Data
US 2002/0130869 A1  Sep. 19, 2002

Related U.S. Application Data

(60) Provisional application No. 60/246,908, filed on Nov. 8, 2000.

(51) Int. Cl.
*G06F 17/50* (2006.01)
(52) U.S. Cl. .................. 703/1; 700/182; 707/104.1
(58) Field of Classification Search .............. 703/1; 700/97, 182; 707/10, 104.1
See application file for complete search history.

(56) References Cited

U.S. PATENT DOCUMENTS

| | | | |
|---|---|---|---|
| 4,875,162 A | 10/1989 | Ferriter et al. | 364/401 |
| 4,922,432 A | 5/1990 | Kobayashi et al. | 364/490 |
| 5,293,479 A | 3/1994 | Quintero et al. | 395/161 |
| 5,493,679 A * | 2/1996 | Virgil et al. | 707/104.1 |
| 5,646,862 A | 7/1997 | Jolliffe et al. | 364/488 |
| 5,706,453 A | 1/1998 | Cheng et al. | 395/347 |
| 5,819,062 A | 10/1998 | Srikantappa | 395/500 |
| 5,838,328 A | 11/1998 | Roller | 345/420 |
| 5,907,494 A | 5/1999 | Dangelo et al. | 364/488 |
| 5,970,490 A * | 10/1999 | Morgenstern | 707/10 |
| 6,038,262 A | 3/2000 | Ganter | 375/296 |
| 6,445,974 B1 * | 9/2002 | Malaugh et al. | 700/182 |
| 6,591,278 B1 * | 7/2003 | Ernst | 707/104.1 |
| 6,748,419 B1 * | 6/2004 | Grayson et al. | 709/205 |
| 6,778,870 B1 * | 8/2004 | Li et al. | 700/97 |

* cited by examiner

*Primary Examiner*—Albert W. Paladini
(74) *Attorney, Agent, or Firm*—Gifford, Krass, Groh, Sprinkle, Anderson & Citkowski, P.C.

(57) ABSTRACT

A universal CAD-neutral data management system capable of two-way exchange of information between a CAD-neutral database and any one of a variety of proprietary CAD graphics platforms. An updateable CAD-neutral database includes parameter descriptions arrayed against parameter values and may further include parameter type information.

21 Claims, 5 Drawing Sheets

COMPUTER-AIDED DESIGN NEUTRAL GRAPHICAL DATA INTERFACE

RELATED APPLICATION

This application claims priority of U.S. Provisional Patent Application 60/246,908 filed Nov. 8, 2000 and is incorporated herein by reference.

FIELD OF THE INVENTION

The present invention relates to computer-aided design and, more particularly, to a universal database capable of sharing and updating data with disparate computer-aided design graphics platforms.

BACKGROUND OF THE INVENTION

Computer-aided design (CAD) relies upon the mathematical representation of an object as a series of values. The values upon insertion into known equations representing the object geometry yields a rendering having the dimensions of the object. The ordering of values relative to geometric equation variables defines the kernel of the object for a specific equation. Since the ordering of equation variables, coordinate systems and mathematical group theory elements can be chosen arbitrarily, different CAD algorithms can successfully model the same object.

The kernel differences between competitive, stand-alone CAD graphics platforms results in duplication of CAD drafting in instances where multiple CAD format graphics are required. The duplication of CAD drafting in multiple formats is a time consuming, nonproductive task prone to comparative errors between the different CAD format renderings.

Prior art attempts to form a CAD-neutral kernel relating to an object have focused on creating translation programs in order to format an object kernel data set into a form accepted by a given CAD graphics platform. U.S. Pat. No. 5,819,062 is a representative example thereof. While translators allow one to compile a single CAD format neutral database, renderings must still be performed in each graphics platform format thus retaining the duplicative rendering limitation. Furthermore, subsequent modifications to the CAD-neutral database must be translated and communicated to each of the graphics platforms requiring duplicative graphics renderings. Translator programs also create format errors that are healed in a time-consuming process. These limitations are compounded when applied to the next generation parametric graphics platforms. Thus, there exists a need for a CAD-neutral object parameter descriptor database capable of providing data cell addressing to allow a variety of graphical platforms to access the same data set and further to allow changes to be made while utilizing a given graphical platform to update the universal CAD-neutral database.

SUMMARY OF THE INVENTION

A universal computer-aided design system is described including a computer-aided design neutral database having values within addressable data cells. A computer-aided design graphics platform operating on a readable format unique to that platform accesses the values within the data cells through an export routine as readable formatted data independent of translation. A computer is provided capable of executing the export routine. The use of a neutral database for exporting parameters to a first graphics platform and receiving updated data from the first graphics platform is provided. The updated data is then capable of being displayed on a second graphics platform independent of translation.

A process for computer-aided design rendering is also detailed including the steps of storing values within addressable cells of a computer-aided design neutral database and delivering those values to one of a plurality of computer-aided design graphics platforms in a format readable by the graphics platform of interest independent of translation.

DESCRIPTION OF THE INVENTION

Figure 1:
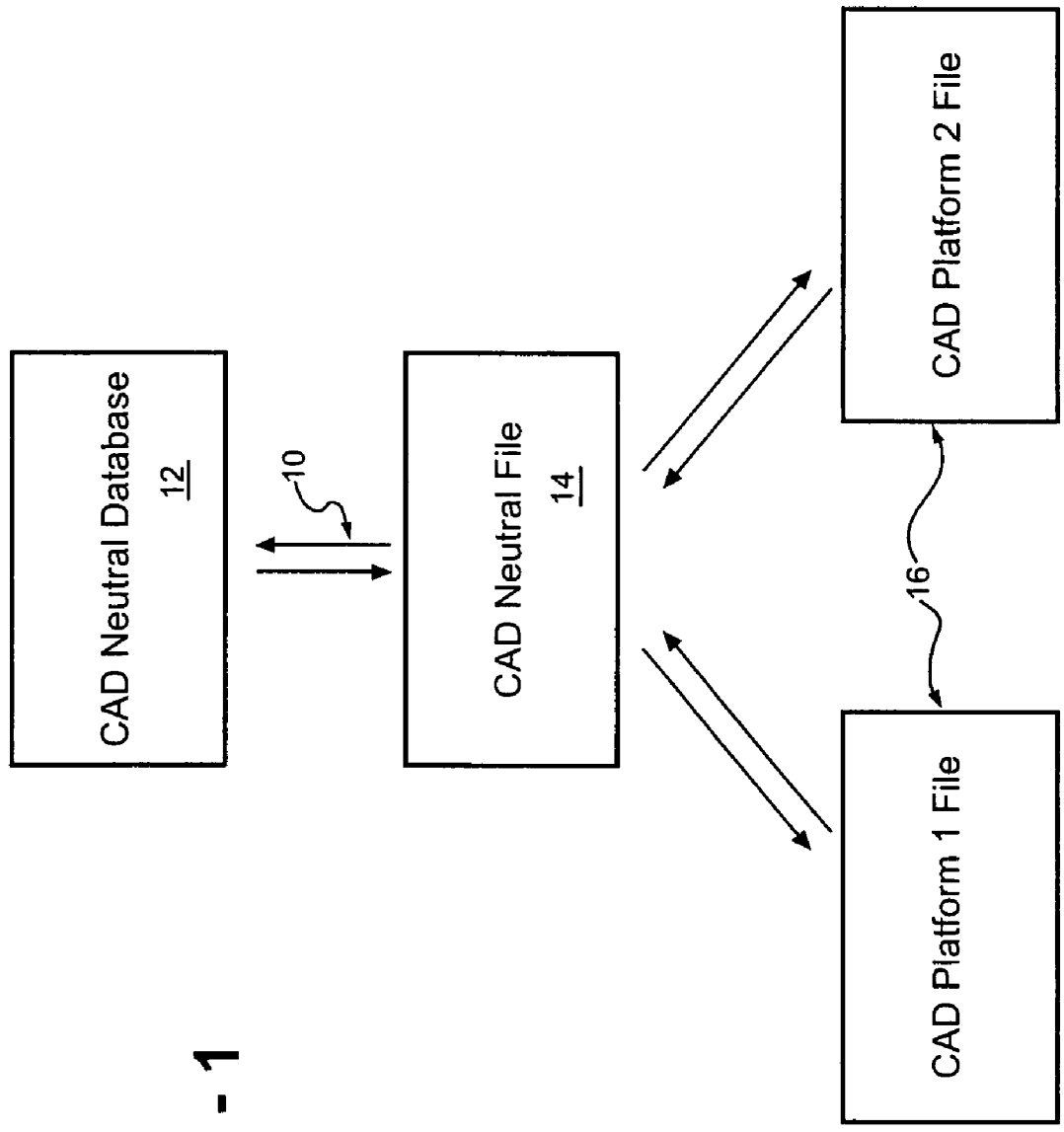
FIG. 1 is a flow diagram illustrating relational aspects of a CAD-neutral database, a CAD-neutral file and CAD platforms.

The present invention includes a computer-based universal CAD-neutral data management system capable of two-way exchange of information between the CAD-neutral database and any one of a variety of proprietary CAD graphics platforms. The present invention, unlike prior art translation and healing models, addresses a CAD graphics platform to data cells within the CAD-neutral database. As a result, design and parametric modifications to a rendering created within a CAD graphics platform or plurality of disparate CAD graphics platforms are used to update data cells within the CAD-neutral database. FIG. 1 illustrates general aspects of the present invention showing bi-directional information flow (10) between a CAD-neutral database of the present invention (12) and a CAD-neutral file (14). FIG. 1 further illustrates the possible transfer of information between a CAD-neutral file (14) and disparate CAD platforms (16) which allows a user to take advantage of the modeling capabilities of multiple CAD programs without the disadvantages of translation and healing.

Optionally, a query routine program prompts a user to supply input information. The information relating illustratively to engineering, CAD, performance requirements, pricing, and component availability. The user supplied data to the query routine program is stored in the CAD-neutral database according to the present invention. Thus, efficiencies of engineering and designing components as well as sharing such designs between CAD platforms is provided according to the present invention.

CAD-Neutral Database

Figure 2:
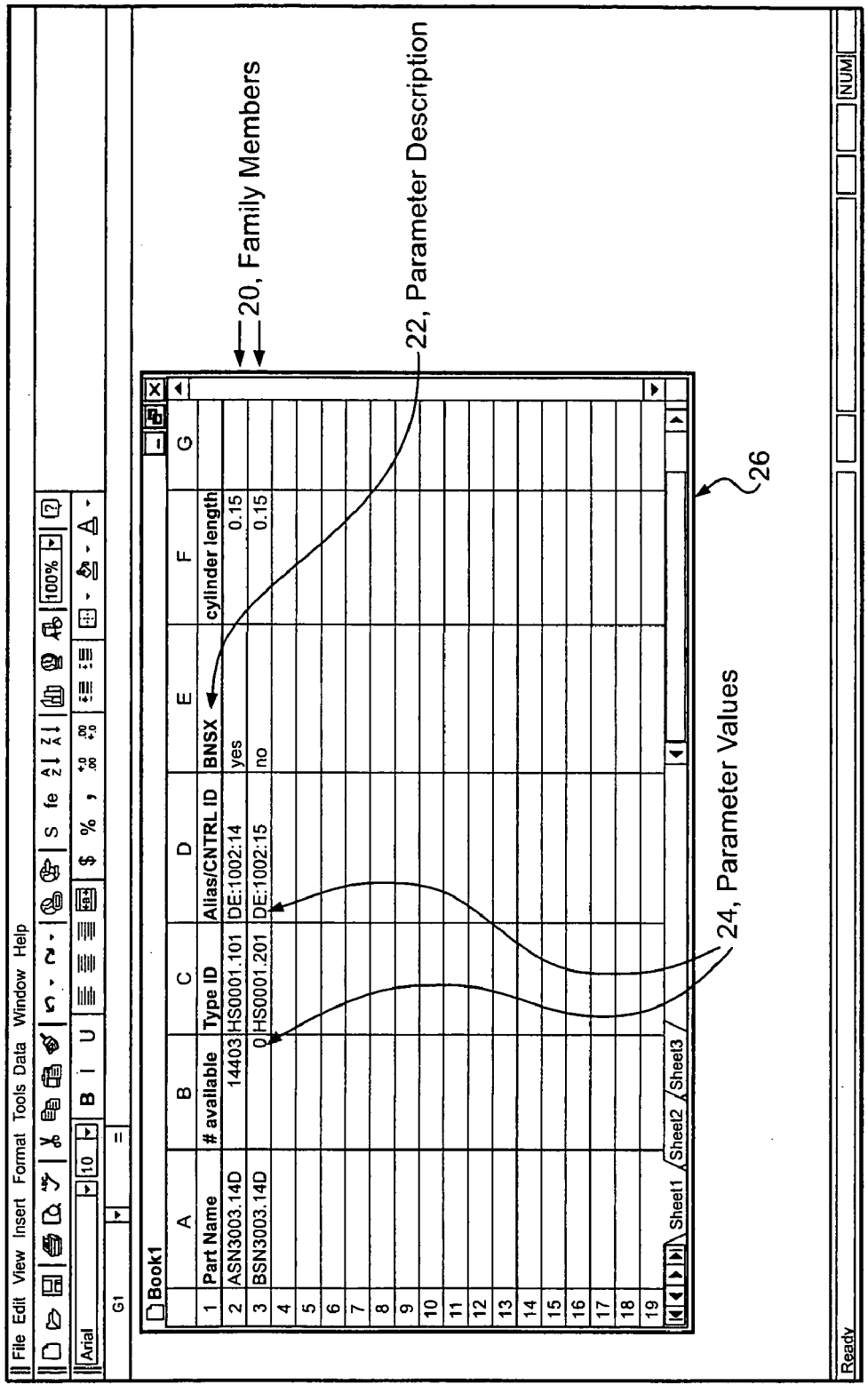
FIG. 2 is a drawing illustrating CAD-neutral database and CAD-neutral file components.

A CAD-neutral database of the present invention includes names and attributes of various parts. A database is ordered such that parts are organized into part families defined by shared characteristics identified in the database or recognizable by one skilled in the art. Referring to FIG. 2, a part family includes family members (20) having specific attributes, referred to herein as parameter descriptions (22), some of which are shared by other family members and some of which are not shared. A parameter description (22) includes a physical property of a part family member such as size, shape, color, material or weight. For example, washers define a part family in which family members each have an internal and an external diameter. Thus, one parameter description (22) for the washer part family is internal diameter, while a second is external diameter. A parameter description (22) further includes an information packet such as part name, part number, price, inventory status, manufacturer and a computer web link to a manufacturer for example. In addition to its roles described above and below regarding a part family and a parameter value, a parameter description (22) has functionality in the system. First, the parameter description (22) provides the store name of the parameter and description of the parameter once for all family members/parameters e.g. name=ZE, description=cylinder length. Second, a parameter description (22) has a parameter type (not shown) such as dimensional, textual, switch or miscellaneous. Parameter type also includes XML, currency, date and specially custom defined parameter types as desired for interaction with a particular system. A single parameter description may have more than one parameter type or none at all. A parameter description may be limited in scope to apply to one or more of a larger total of systems. Scope limitations are desired to correct for limitations in system software or business process where additional information must be shared to one or more systems to achieve the correct result.

A specific value, identified here as a parameter value (24), is chosen from a range of possible values and arrayed against a parameter description. FIG. 2 illustrates such an array in an EXCEL spreadsheet (26). A parameter value (24) is the actual value of a family member captured in the CAD-neutral database. A parameter value (24) fills a specific value for a combination of one family member (20) and one parameter description (22) for one part family. Thus a parameter value (24) defines some differences between family members (20). A parameter value (24) is in the form of text, a numerical indicator, a Boolean expression, a mathematical equation or a combination thereof.

A computer database according to the present invention is created and/or modified to meet the specific requirements of a particular designer, project, company or industry. A database as described herein relates to a part database used in conjunction with a CAD platform but it will be recognized by one of skill in the art that a database according to the present invention is used in other applications illustratively including business systems such as Enterprise Resource Planning (ERP), cost planning, scheduling and optimization.

Figure 3:
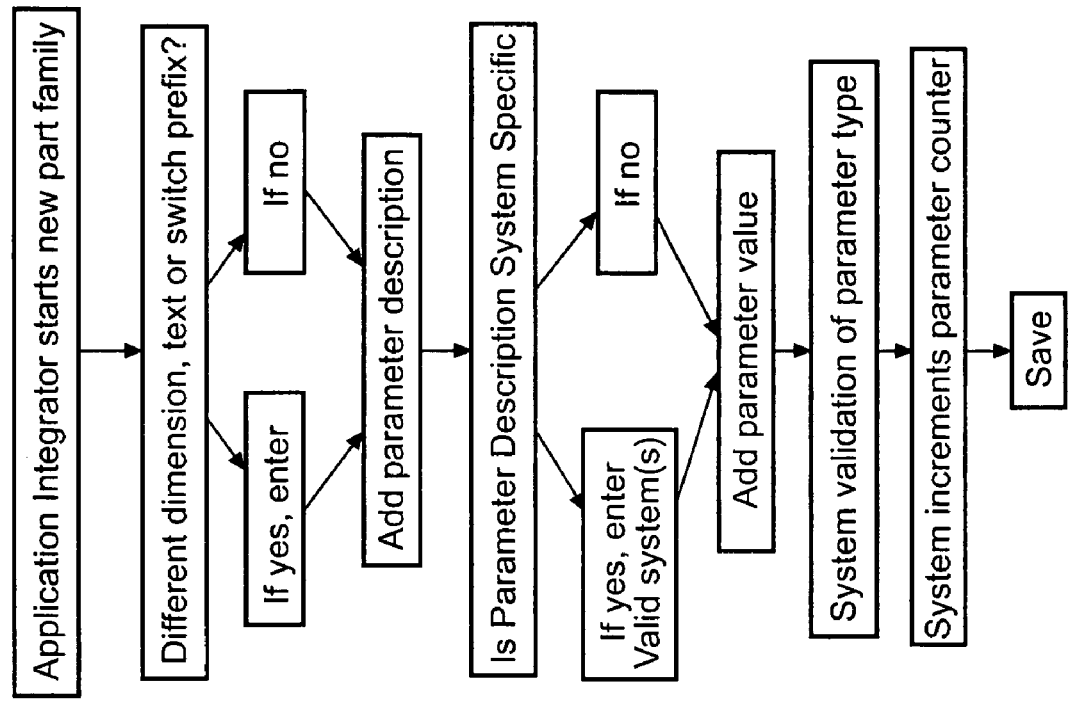
FIG. 3 is a flow diagram illustrating a process for modifying a CAD-neutral database.

Modifications to a database include changes to parameter values or parameter descriptions of existing part families or part family members and creation of part families and part family members. This process stores or loads the part family, its family members and their associated parameter values into a database or structured format such as a proprietary format (SQL*Server or Oracle for example) or an XML-based format (standards-based). FIG. 3 illustrates aspects of the process of CAD-neutral database modification process, shown generally at 32. A modification is accomplished by an application integrator logged into the system who has authorization to edit the database or part of the database. For example, to create a part family, an application integrator starts a new part family 31 via an appropriate signal to the system, such as clicking on a labeled icon or opening a blank template and saving under the new part family name. The application integrator is queried if the part family has different dimension, text or switch prefix 32, if so, then the application integrator enters a new prefix 33. The system is optionally set to indicate which parameters need to be filled out for a new child. For example, a screen with blank fields is presented for the application integrator to fill out. If no new prefix is needed 34 the integrator continues. The system is also optionally set to indicate which parameter descriptions may be system specific. Parameter descriptions by default are set to apply to all systems unless they are specially scoped to a subset of systems. The application integrator adds one or more parameter values of one or more parameter types 35. The system validates the parameter type and data 36, ensuring for example that dimension is valid float/double and non-null, switch is "on" or "off" and text is non-null where appropriate. The system increments a suitable parameter counter for each successful parameter type 37. Further, the system saves the parameter value data and associates it with the part family 38. Where the application integrator adds a CAD part or template file to the part family, the part or file type, such as UNIGRAPHICS, I-DEAS, CATIA, PRO-ENGINEER or AUTOCAD is indicated and the system saves a reference to a CAD model. The CAD part file is optionally added prior to adding or changing parameters.

Optionally, the application integrator indicates that more than one modification is to be made during a session. A switch feature is toggled "on" or "off" depending on the number of changes to be entered.

In a further option, the system is configured so as to give feedback to an application integrator at various stages in the database modification process. For example, the system gives an error message when a bad login identification or incorrect password is entered. The system is optionally configured to increment the system error log to note any such invalid access attempt along with the date, time and other information identifying the location from which access to the system was attempted. Further examples of situations in which a system error message or status message is given include when inappropriate parameter data is entered and where file naming does not conform to CAD limitations. In these cases, the invalid parameter value data or inappropriate file name may be cleared by the system or highlighted so that the next keyboard entry clear the parameter value field.

Preferably, a part family, a family member, a parameter description, a parameter value or a combination thereof are cross-referenced and searchable.

A database according to the present invention optionally tracks events related to files created and location of such files. For example, a database incorporates a log function and files wherein such information as date, file name and location is recorded and available to a user.

Creation of CAD-Neutral Format File

A designer interacts with a database according to the present invention to create a CAD-neutral format file which is then used to create a CAD model. In a process for creating a CAD-neutral format file using a database according to the present invention, a designer interacts with a user interface to perform several steps including: selecting a part family, chosing one or more family members, choosing a destination CAD system by active selection or by default setting, opening a new or existing file, transferring the data, and saving the file in CAD-neutral format. Selections from a part family are optionally guided by an export wizard that helps the designer select family members. The wizard leverages the parameter descriptions as categories and subsets of acceptable parameter values in a user chosen sequence to specify the appropriate family members for export.

Figure 4:
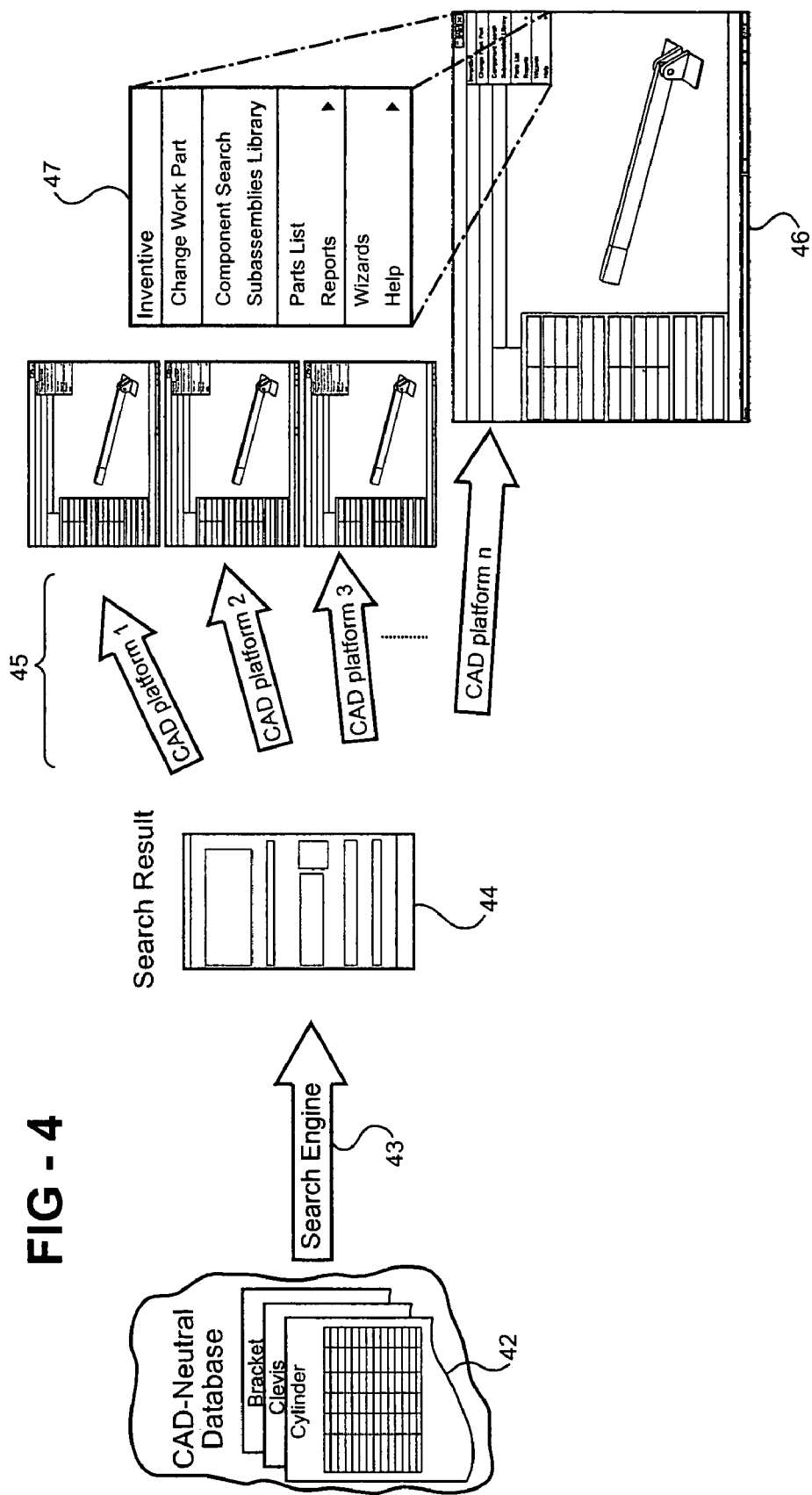
FIG. 4 is a drawing illustrating export of a CAD-neutral file from a CAD-neutral database and generation of a CAD model in various CAD programs.

A designer interacts with a user interface by indicating a desired action to the system. For example, a designer uses a mouse to click on a button labeled "create part" in order to open a new file. It will be evident to one of skill in the art that a designer may indicate a desired action in other ways depending on the functionalities embedded in the system. For instance, a designer enters a keyword into a text box or clicks on a menu tab. Upon opening a new file a designer will enter data into the file. For example, a family member having a particular parameter value for a parameter description of interest is entered by choosing from a list of items in a database. Referring now to FIG. 4, database items may be displayed for a designer's choice as a whole list, from tabbed menus or any alternative known to one skilled in the art 42. The database is searchable by any relevant term such as part family, family member, parameter description and parameter value or a combination thereof 43. A search displays results which may be selected and thereby entered into the file 44. These steps or an appropriate subset of steps are repeated as many times as necessary to create a file containing a list of part names and attributes to be incorporated in the CAD model. The file is exported to a standard execution directory 44. The designer chooses a desired CAD system for export during the process of creating a CAD-neutral format file 45. The choice of CAD system destination may be set as a user preference such that a template file opens by default incorporating the designation of a particular CAD platform 46. Where a CAD platform choice is indicated, the system validates user part choices for compatibility (not shown). Invalid choices may be cleared by the system or highlighted so that the next keyboard entry clears the parameter value field. The designer may save the file at any point for later changes or may choose to "create CAD model" which results in export of the file in neutral file format and places the file into the export directory. The system triggers a CAD Toolkit Program for the chosen CAD system 47.

A user interacts with an inventive database to transfer various types of information to a CAD platform. For example, an application integrator chooses a part family, a family member, multiple part families, selected groups of family members from differing part families and combinations thereof. Where an individual family member is chosen, parameters are exported in flat file formats. In the case that an entire part family is chosen, information is transferred in a form supported by the destination CAD system including a spreadsheet format such as EXCEL and XESS. Similarly, disjoint selections or groups of noncontiguous selections are transferred in a form supported by the destination CAD system as for an entire part family. The neutral file format may be represented in one of several file formats including EXCEL, XESS, XML, or flat files containing name=value pairs, comma-separated values (CSV) or delimited field formats. The neutral file format is an exported manifestation of the information stored in the CAD Neutral database that includes parameters common across platforms as well as any parameters specific to a given platform or formatting thereof required for a correct reading of the parameter values by the target platform. A CAD-neutral format file uses conventions common or highly similar in CAD systems for storage of name=value pairs. The storage mechanism is a format such as an open format like XML, or a flat file, such as a de facto standard like Microsoft Excel or an industry-chosen standard like Xess.

Import and export of information in neutral file format is primarily described herein in conjunction with creation of a CAD model and update of an inventive database but it will be recognized by one of skill in the art that exchange of information according to the present invention is used in other applications illustratively including rapid population of the system, outside optimization of the actual parameters and use of information by other business systems.

Figure 5:
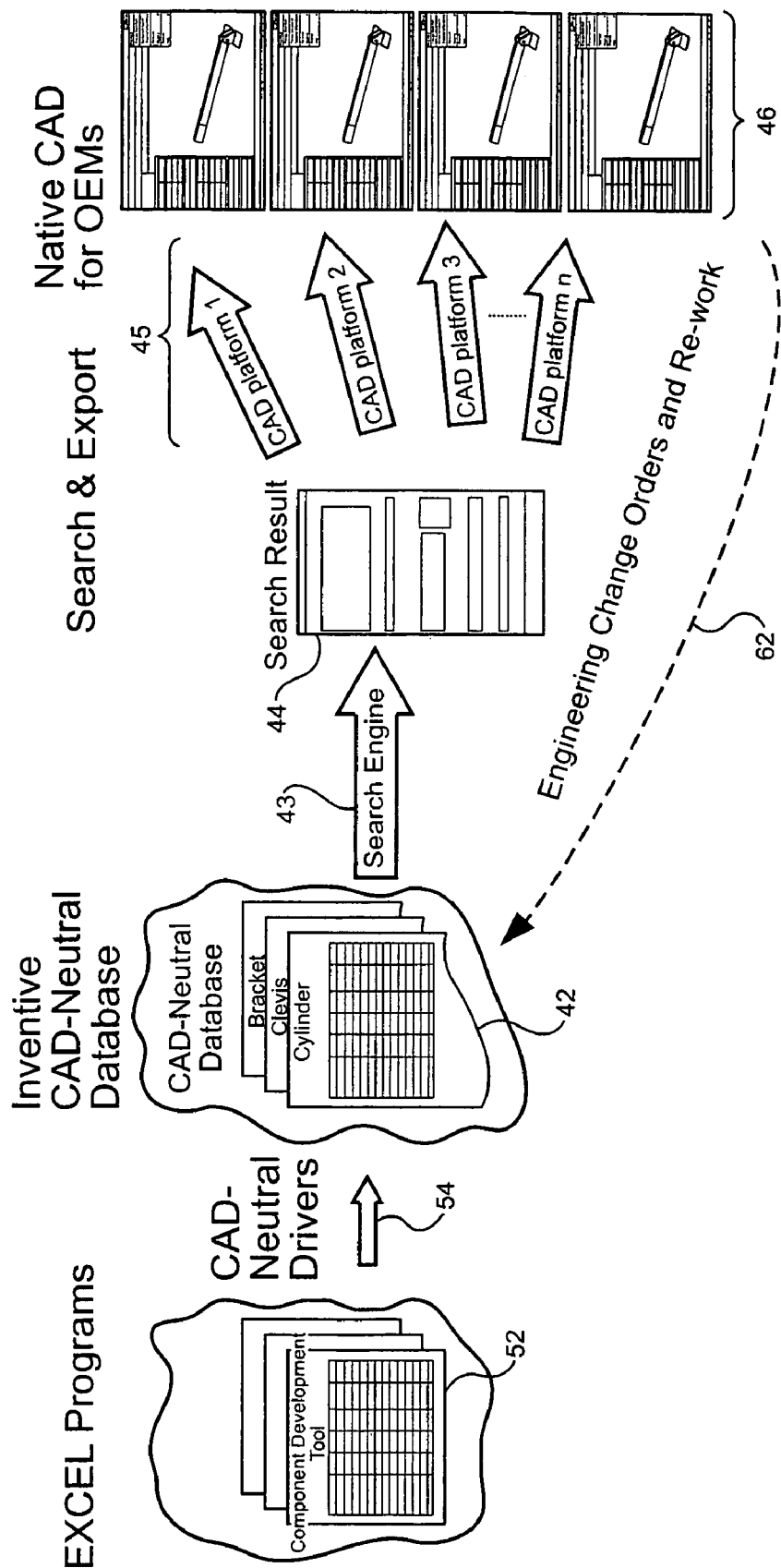
FIG. 5 is a drawing illustrating import and export of a CAD-neutral file from a CAD-neutral database and generation of a CAD model in various CAD programs.

Two-Way Exchange of Information Between a CAD-Neutral Format File and a CAD Graphics Platform A process of the present invention allows transfer of information both from a CAD-neutral format file to a CAD platform and from a CAD platform to a CAD-neutral format file. Referring to FIG. 5, data including part family information, family member information, parameter descriptions, parameter values and parameter types is input into an inventive database (42) from any of a number of source file formats such as an EXCEL file (52) in conjunction with a CAD-neutral driver (54) where like numbers correspond to the descriptions thereof with respect to FIG. 4. Part information is selected from an inventive database by choosing from a displayed list of all available choices or from a search engine generated list (44). A CAD-neutral file is exported from the system. A user chooses from a list of destination CAD platforms (45) and CAD-specific information is attached to the file components as necessary to provide information to a selected CAD graphics platform in order to create a CAD model (46). A designer may make design and parametric modifications within a proprietary CAD graphics platform during the process of model creation. Such modifications are exported from the CAD graphics program to update data within the CAD-neutral format file and/or the CAD-neutral format database (62). Such updating is optionally done in the form of versioning wherein the original data is not overwritten but rather a subsequent database file is created. The updated CAD-neutral format file or database is saved and is available for export to another CAD graphics platform without translation. This process is repeated as necessary.

Optionally, the inventive database is accessed from within a chosen CAD operating system. Changes to a CAD model entered into a CAD program are incorporated into a file to be exported from the CAD program and imported into an inventive database. A file exported from a CAD program is in a format such as a flat file format or spreadsheet format such as EXCEL or XESS.

Any publications mentioned in the specification or appendix thereto are indicative of the levels of those skilled in the art to which the invention pertains. These publications are herein incorporated by reference to the same extent as if each individual publication was specifically and individually indicated to be incorporated by reference.

The foregoing description is illustrative of particular embodiments of the invention, but is not meant to be a limitation upon the practice thereof.

The invention claimed is:

1. A universal computer-aided design system comprising:
   a computer-aided design neutral database ordered into a part family sharing a parameter description between at least two parts within said part family, said database having parameter values within addressable data cells;
   a computer-aided design graphics platform operating on readable formatted data unique to said platform;
   an export routine capable of conveying the values within the data cells to said platform as readable formatted data independent of translation; and
   a computer capable of executing the export routine.

2. The universal computer-aided design system of claim 1 further comprising a plurality of said platforms and corresponding export routines wherein each of said plurality of platforms is interactive with said computer-aided design neutral database by said corresponding export routine.

3. The universal computer-aided design system of claim 1 wherein a modification to the readable formatted data within said platform updates the values in said computer-aided design neutral database.

4. The universal computer-aided design system of claim 1 wherein said computer-aided design neutral database having values is arranged with said part family comprising a plurality of part family members.

5. The universal computer-aided design system of claim 1 further comprising a query routine program prompting a user for input, said program storing the input in said computer-aided design neutral database.

6. The universal computer-aided design system of claim 4 where said part family member is described by a parameter description having at least one physical property selected from a group consisting of: size, shape, color, material, and weight.

7. The universal computer-aided design system of claim 5 wherein said parameter description further comprises at least one information packet selected from a group consisting of: part name, part number, price, inventory, manufacturer, and a computer web link to the manufacturer.

8. A universal computer-aided design system comprising:
a computer-aided design neutral database ordered into a part family sharing a parameter description between at least two parts within said part family, said database having parameter values within addressable data cells;
a plurality of computer-aided design graphics platforms each operating on readable formatted data unique to said platform; and
a plurality of export routines, corresponding to said plurality of computer-aided design graphics platforms wherein each of said plurality of platforms is interactive with said database by said computer-aided design neutral corresponding export routine.

9. The universal computer-aided design system of claim 8 wherein a modification to the readable formatted data within said platform updates the values in said computer-aided design neutral database.

10. The universal computer-aided design system of claim 8 wherein said computer-aided design neutral database having values is arranged with said part family comprising a plurality of part family members.

11. The universal computer-aided design system of claim 8 further comprising a query routine program prompting a user for input, said program storing the input in the computer-aided design neutral database.

12. The universal computer-aided design system of claim 11 where said parameter description has at least one physical property selected from a group consisting of: size, shape, color, material, and weight.

13. The universal computer-aided design system of claim 12 wherein said parameter description further comprises at least one information packet selected from a group consisting of: part name, part number, price, inventory, manufacturer, and a computer web link to the manufacturer.

14. A universal computer-aided design system comprising:
a computer-aided design neutral database having values within addressable data cells;
a file created from said computer-aided design neutral database ordered into a part family sharing a parameter description between at least two parts within said part family in a computer-aided design neutral file format;
a computer-aided design graphics platform operating on readable formatted data unique to said platform;
an export routine capable of conveying the values within said file to said platform as readable formatted data independent of translation;
an import routine capable of conveying values from said platform as readable formatted data independent of translation; and
a computer capable of executing the export and import routines.

15. A process for computer-aided design rendering comprising the steps of:
storing values within addressable data cells of a computer-aided design neutral database; and
delivering the values to one of a plurality of computer-aided design graphics platforms in a format readable by one of said graphics platforms independent of translation.

16. The process of claim 15 further comprising the step of updating said computer-aided design neutral database from said computer-aided design graphics platform.

17. The process of claim 15 further comprising the step of performing parametric modeling prior to updating said computer-aided design neutral database.

18. The process of claim 15 wherein values stored within said computer-aided design neutral database are arranged with said part family comprising a plurality of part family members.

19. The use of a computer-aided design neutral database ordered into a part family sharing a parameter description between at least two parts within said part family for exporting parameters to a first graphics platform, said computer-aided design neutral database receiving updated data from said first graphics platform and displaying said updated data on a second disparate graphics platform independent of translation.

20. The use of a computer-aided design neutral database according to claim 19 wherein said first and said second graphics platforms are computer-aided design platforms.

21. The process of claim 15 further comprising the step of inputting data into said computer-aided design neutral database through one of said plurality of computer-aided design graphics platforms.

* * * * *